United States Patent
Kuan et al.

(10) Patent No.: US 7,465,488 B2
(45) Date of Patent: Dec. 16, 2008

(54) BOW CONTROL IN AN ELECTRONIC PACKAGE

(75) Inventors: Lee Choon Kuan, Singapore (SG); Lee Kian Chai, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/457,223

(22) Filed: Jul. 13, 2006

(65) Prior Publication Data

US 2006/0244141 A1 Nov. 2, 2006

Related U.S. Application Data

(63) Continuation of application No. 10/118,580, filed on Apr. 8, 2002, now Pat. No. 7,161,236.

(30) Foreign Application Priority Data

Sep. 10, 2001 (SG) .............................. 200105518-5

(51) Int. Cl.
*B32B 3/00* (2006.01)
*H01L 23/52* (2006.01)
*H01L 29/40* (2006.01)
(52) U.S. Cl. ...................... 428/209; 428/98; 428/195.1; 438/121; 438/637; 438/926; 438/928; 257/691; 257/E23.144; 257/E23.149; 257/E23.193; 174/262; 174/357; 174/657; 174/663
(58) Field of Classification Search ................ 438/121, 438/926, 928, 637; 174/357; 428/209; 257/691, 257/714
See application file for complete search history.

(56) References Cited

U.S. PATENT DOCUMENTS

| | | | |
|---|---|---|---|
| 4,639,388 A | 1/1987 | Ainsworth et al. | |
| 4,841,134 A | 6/1989 | Hida et al. | |
| 5,150,194 A | 9/1992 | Brooks et al. | |
| 5,214,307 A | 5/1993 | Davis | |
| 5,399,902 A | 3/1995 | Bickford et al. | |
| 5,463,250 A | 10/1995 | Nguyen et al. | |

(Continued)

FOREIGN PATENT DOCUMENTS

EP 0345809 8/1995

(Continued)

OTHER PUBLICATIONS

"U.S. Appl. No. 09/648,316 Non Final office action mailed May 8, 2002". 12 pgs.

(Continued)

*Primary Examiner*—Dao H Nguyen
(74) *Attorney, Agent, or Firm*—Schwegman, Lundberg & Woessner, P.A.

(57) ABSTRACT

A package including a package substrate, a die-substrate assembly including a substrate including a plurality of layers including a layer having a mesh to stiffen the substrate adapted to mount one or more dice, one or more dice mounted on the substrate and a molding compound to attach the substrate to the package substrate. Various embodiments include a method comprising providing a substrate including a layer having an outer surface, depositing a metal layer on the outer surface, and etching the metal layer to form an opening, the opening enclosing an area on the outer surface to mount one or more dice.

22 Claims, 7 Drawing Sheets

U.S. PATENT DOCUMENTS

| | | | |
|---|---|---|---|
| 5,650,246 | A | 7/1997 | Dopp et al. |
| 5,733,800 | A | 3/1998 | Moden |
| 5,841,194 | A | 11/1998 | Tsukamoto |
| 5,864,175 | A | 1/1999 | Burns |
| 5,889,318 | A | 3/1999 | Corisis |
| 6,002,165 | A | 12/1999 | Kinsman |
| 6,015,722 | A | 1/2000 | Banks et al. |
| 6,015,955 | A | 1/2000 | Farooq et al. |
| 6,059,917 | A | 5/2000 | Kyle |
| 6,111,307 | A | 8/2000 | Corisis |
| 6,140,707 | A * | 10/2000 | Plepys et al. ............. 257/778 |
| 6,147,374 | A | 11/2000 | Tanaka et al. |
| 6,204,559 | B1 | 3/2001 | Lin et al. |
| 6,224,711 | B1 | 5/2001 | Carden et al. |
| 6,262,364 | B1 | 7/2001 | Yoshikawa et al. |
| 6,274,938 | B1 | 8/2001 | Ohuchi et al. |
| 6,280,584 | B1 | 8/2001 | Kumar et al. |
| 6,285,080 | B1 | 9/2001 | Bezama et al. |
| 6,326,681 | B1 | 12/2001 | Murakami et al. |
| 6,329,603 | B1 | 12/2001 | Japp et al. |
| 6,384,487 | B1 | 5/2002 | Smith |
| 6,396,131 | B1 | 5/2002 | Kinsman et al. |
| 6,404,062 | B1 | 6/2002 | Taniguchi et al. |
| 6,424,027 | B1 | 7/2002 | Lamson et al. |
| 6,444,340 | B1 | 9/2002 | Jaffrey |
| 6,472,747 | B2 | 10/2002 | Bazarjani et al. |
| 6,507,100 | B1 | 1/2003 | Valluri et al. |
| 6,534,852 | B1 | 3/2003 | Lin et al. |
| 6,552,425 | B1 | 4/2003 | Yan et al. |
| 6,887,740 | B2 | 5/2005 | Tandy et al. |
| 6,914,326 | B2 | 7/2005 | Rumsey et al. |
| 7,095,097 | B2 | 8/2006 | Tandy et al. |
| 7,161,236 | B2 | 1/2007 | Kuan et al. |
| 7,235,872 | B2 | 6/2007 | Kuan et al. |
| 2002/0100989 | A1 | 8/2002 | Jiang et al. |
| 2002/0155341 | A1 | 10/2002 | Finkelshtain et al. |
| 2002/0171142 | A1 | 11/2002 | Kinsman |
| 2002/0171157 | A1 | 11/2002 | Soga et al. |
| 2002/0190388 | A1 | 12/2002 | Eytcheson |
| 2003/0030968 | A1 * | 2/2003 | Tsao et al. ............. 361/329 |
| 2003/0035938 | A1 * | 2/2003 | Lai ............. 428/209 |
| 2005/0023653 | A1 | 2/2005 | Tandy et al. |
| 2005/0029552 | A1 | 2/2005 | Kuan et al. |
| 2006/0141673 | A1 | 6/2006 | Tandy et al. |

FOREIGN PATENT DOCUMENTS

| | | |
|---|---|---|
| JP | 2001-217364 | 8/2001 |
| WO | WO-01/78109 | 10/2001 |

OTHER PUBLICATIONS

"U.S. Appl. No. 09/648,316 Notice of allowance mailed Nov. 4, 2002", 9 pgs.

"U.S. Appl. No. 09/648,316 Response filed Aug. 7, 2002 to Non Final office action mailed May 8, 2002", 7 pgs.

"U.S. Appl. No. 10/118,580 Final Office action mailed Mar. 2, 2005", 27 pgs.

"U.S. Appl. No. 10/118,580 Non/final Office action mailed May 2, 2003", 17 pgs.

"U.S. Appl. No. 10/118,580 Non/final Office action mailed Aug. 16, 2004", 25 pgs.

"U.S. Appl. No. 10/118,580 Non/final Office action mailed Aug. 19, 2005", 23 pgs.

"U.S. Appl. No. 10/118,580 Non/final Office action mailed Oct. 27, 2003", 12 pgs.

"U.S. Appl. No. 10/118,580 Notice of allowance mailed Feb. 27, 2006", 8 pgs.

"U.S. Appl. No. 10/118,580 Notice of allowance mailed Jun. 29, 2006", 7 pgs.

"U.S. Appl. No. 10/118,580 Notice of allowance mailed Oct. 10, 2006", 7 pgs.

"U.S. Appl. No. 10/118,580 312 Amendment and Rsponse filed Aug. 29, 2006", 10 pgs.

"U.S. Appl, No. 10/118,580 Amendment and Response filed May 2, 2005 to Final Office action mailed Mar. 2, 2005", 19 pgs.

"U.S. Appl. No. 10/118,580 Response and amendment filed Jul. 11, 2003 to Non/final Office action mailed May 2, 2003", 21 pgs.

"U.S. Appl. No. 10/118,580 Notice of Allowance mailed Oct. 10, 2006", 7 pgs.

"U.S. Appl. No. 10/118,580 Response filed Apr. 27, 2004 to Non/final Office action mailed Oct. 27, 2003", 14 pgs.

"U.S. Appl. No. 10/118,580 Response filed Nov. 21, 2005 to Non/final Office action mailed Aug. 19, 2005", 18 pgs.

"U.S. Appl. No. 10/118,580 Response filed Dec. 16, 2004 to Non/final Office action mailed Aug. 16, 2004", 28 pgs.

"U.S. Appl. No. 10/412,064 Final office action mailed Sep. 24, 2004", 8 pgs.

"U.S. Appl. No. 10/412,064 Examiner Interview Summary dated Dec. 10, 2004", 6 pgs.

"U.S. Appl. No. 10/412,064 Response filed Nov. 23, 2004 to Final Office Action dated Sep. 24, 2004", 13 pgs.

"U.S. Appl. No. 10/412,064 Non Final Office Action mailed Mar. 10, 2004", 9 pgs.

"U.S. Appl. No. 10/412,064 Notice of Allowance mailed Dec. 21, 2004", 7 pgs.

"U.S. Appl. No. 10/412,064 Response filed Jun. 10, 2004 to Non Final Office Action mailed Mar. 10, 2004", 12 pgs.

"U.S. Appl. No. 10/931,369 Final Office Action mailed Jul. 14, 2005", 7 pgs.

"U.S. Appl. No. 10/931,369 Non Final Office Action mailed Jan. 26, 2005", 7 pgs.

"U.S. Appl. No. 10/931,369 Notice of Allowance mailed Oct. 6, 2005", 6 pgs.

"U.S. Appl. No. 10/931,369 Response filed Apr. 26, 2005 to Non Final Office Action mailed Jan. 26, 2005", 8 pgs.

"U.S. Appl. No. 10/931,369 312 Amendment filed Dec. 22, 2005", 8 pgs.

"U.S. Appl. No. 10/931,369 Response filed Sep. 14, 2005 to Final Office Action mailed Jul. 14, 2005", 9 pgs.

"U.S. Appl. No. 10/931,369 Interview Summary dated Sep. 20, 2005", 3 pgs.

"U.S. Appl. No. 11/358,268 Notice of Allowance mailed Jul. 10, 2007".

U.S. Appl. No. 11/358,268 Notice of Allowance mailed Oct. 17, 2007, 9 pgs.

* cited by examiner

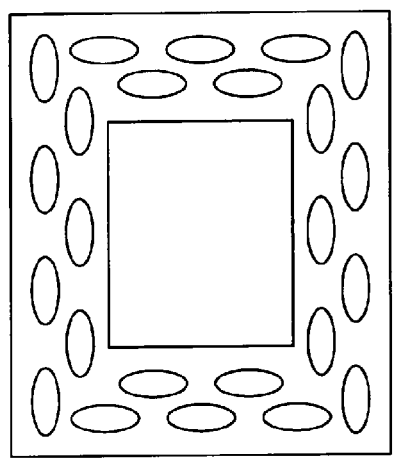
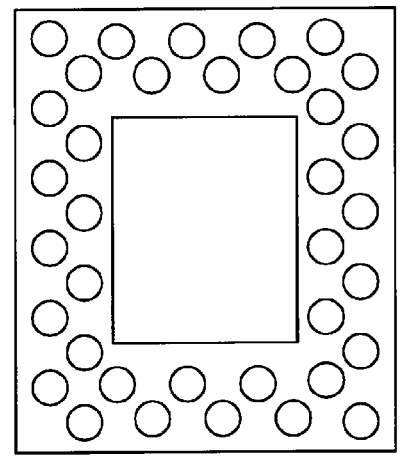
Figure 2I    Figure 2J
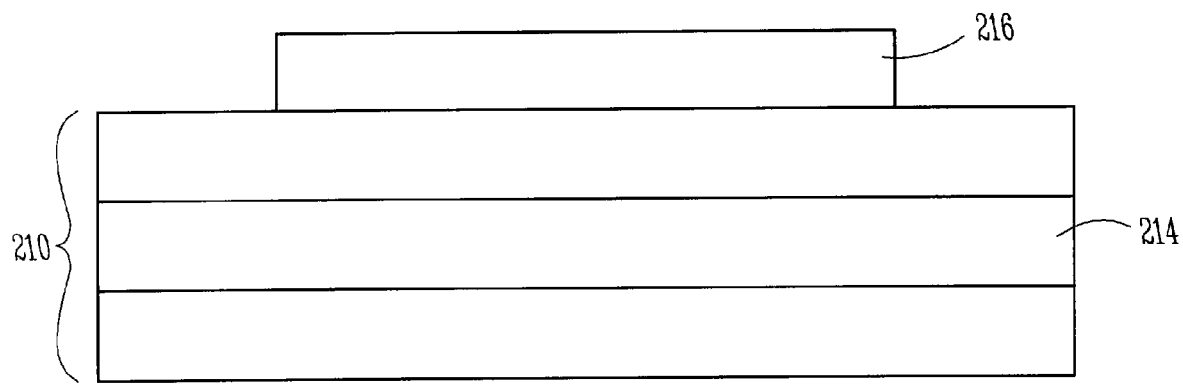
Figure 2K

US 7,465,488 B2

BOW CONTROL IN AN ELECTRONIC PACKAGE

This application is a Continuation of U.S. application Ser. No. 10/118,580, filed Apr. 8, 2002, now U.S. Pat. No. 7,161, 236, which application claims priority under 35 U.S.C. 119 from Singapore Application No. 200105518-5 filed Sep. 10, 2001 now granted as of Feb. 28, 2006 as Patent P-No. 102637, which applications are incorporated herein by reference.

FIELD OF THE INVENTION

The invention relates to electronic circuit packaging and, more particularly, to bow control in an electronic package.

BACKGROUND OF THE INVENTION

FIG. 1 is an illustration of a prior art electronic package 100. The electronic package 100 includes a die 102, a die substrate 104, a package substrate 106, solder elements 108 and a molding compound 110. The die 102 is mounted on the die substrate 104. The die substrate 104 is mounted on the package substrate 106. The purpose of the solder elements 108 is to electrically couple the die substrate 104 to the package substrate 106. The molding compound 110 encapsulates the electronic connections. As can be seen in FIG. 1, the die substrate 104 is encapsulated by the molding compound 110 on only one side of the die substrate 104. During the curing of the molding compound 110, the molding compound 110 shrinks and subjects the die substrate 104 to stress that causes the die substrate 104 to bow. A bowed die substrate 104 causes open connections at the solder elements 108 which increases the electrical failure rate of the electronic package.

For these and other reasons there is a need for an electronic package that resists bowing.

BRIEF DESCRIPTION OF THE DRAWINGS

FIGS. 2F-2J are illustrations of some embodiments of a mesh having mesh opening shapes suitable for use in connection with the die-substrate assembly shown in FIG. 2A according to the teachings of teachings of the present invention;

FIG. 2K is an illustration of a side view of an alternative embodiment of the die-substrate assembly according to the teachings of the present invention.

DESCRIPTION

Figure 1:
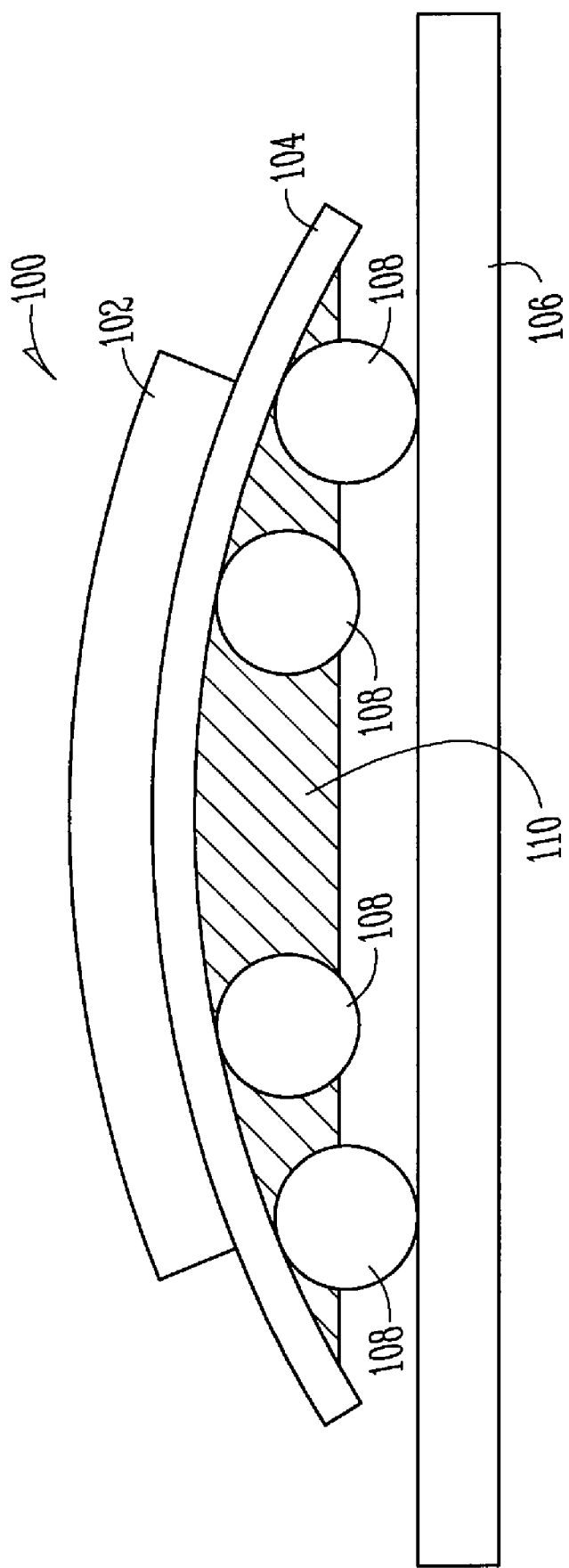
FIG. 1 is an illustration of a side view of a prior art electronic package.

The above mentioned problems associated with bowing and other problems are addressed by the various embodiments of the present invention, and will be understood by reading and studying the present specification.

In the following detailed description of the invention, reference is made to the accompanying drawings which form a part hereof, and in which are shown, by way of illustration, specific embodiments of the invention which may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is not to be taken in a limiting sense, and the scope of the present invention is defined only by the appended claims, along with the full scope of equivalents to which such claims are entitled.

Figure 2A:
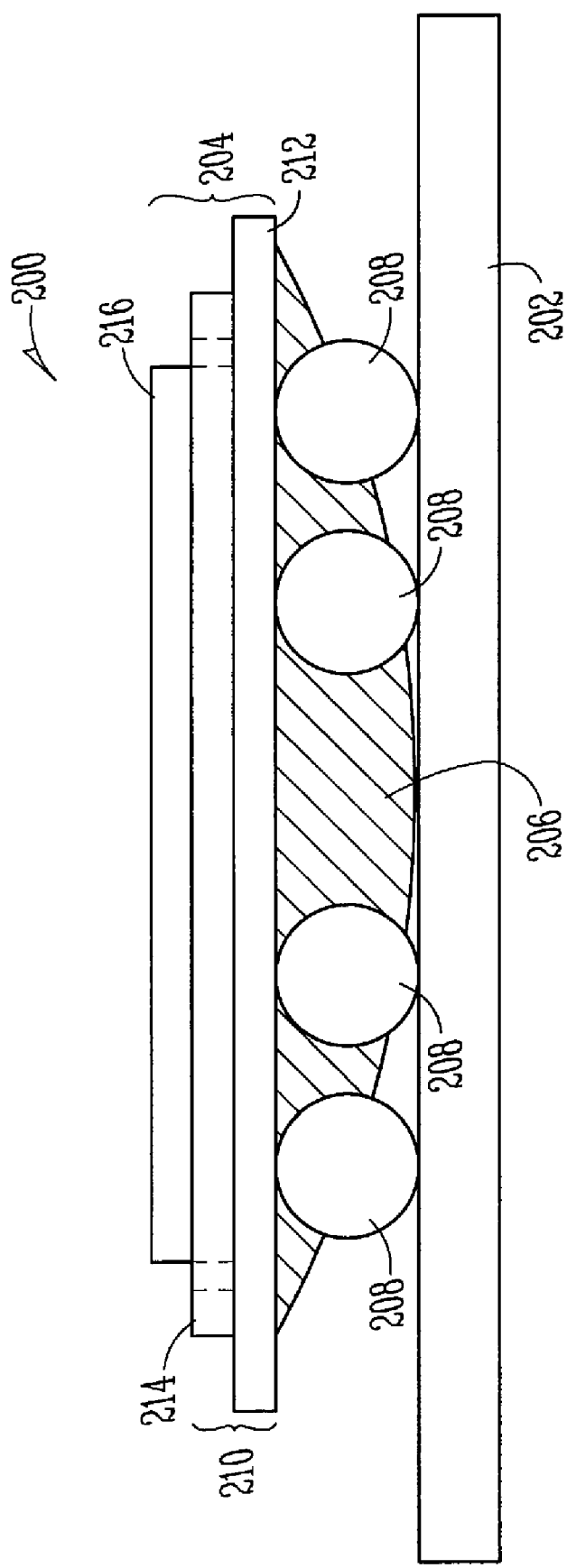
FIG. 2A is an illustration of a side view of one embodiment of a package comprising a package substrate, a die-substrate assembly, a molding compound and solder elements according to the teachings of the present invention.

FIG. 2A is an illustration of a side view of one embodiment of a package 200 comprising a package substrate 202, a die-substrate assembly 204, a molding compound 206 and solder elements 208 according to the teachings of the present invention.

The package substrate 202 provides a base for mounting the die-substrate assembly 204. As such, the package substrate 202 is not limited to being fabricated from a particular material. In some embodiments, the package substrate 202 is fabricated from an insulator or a combination of insulators. Exemplary insulators suitable for use in the fabrication of the package substrate 202 include ceramics, epoxies, fiber glasses or combinations of such insulators. However, the package substrate 202 can also include conductive materials which are formed into conductive paths (not shown) or planes (not shown) to couple electronic signals to-and-from the die-substrate assembly 204.

The die-substrate assembly 204 is mounted on the package substrate 202 and includes a substrate 210. The substrate 210 includes a plurality of layers, such as layers 212 and 214, with the layer 214 including a mesh to stiffen the substrate 210. The substrate 210 is adapted to mount one or more dice, such as die 216. The substrate 210 is electrically coupled to the package substrate 202 by the solder elements 208.

The layer 212 provides a substrate on which to mount the die 216. The layer 212 is not limited to being fabricated from a particular material. In some embodiments, the layer 212 is fabricated from an insulator or combination of insulators. Exemplary insulators suitable for use in the fabrication of the layer 212 include ceramics, epoxies, fiber glasses or combinations of such insulators. However, the layer 212 can also include conductive materials which are formed into conductive paths (not shown) or planes (not shown) to couple electronic signals to-and-from the die-substrate assembly 204.

Figure 2B:
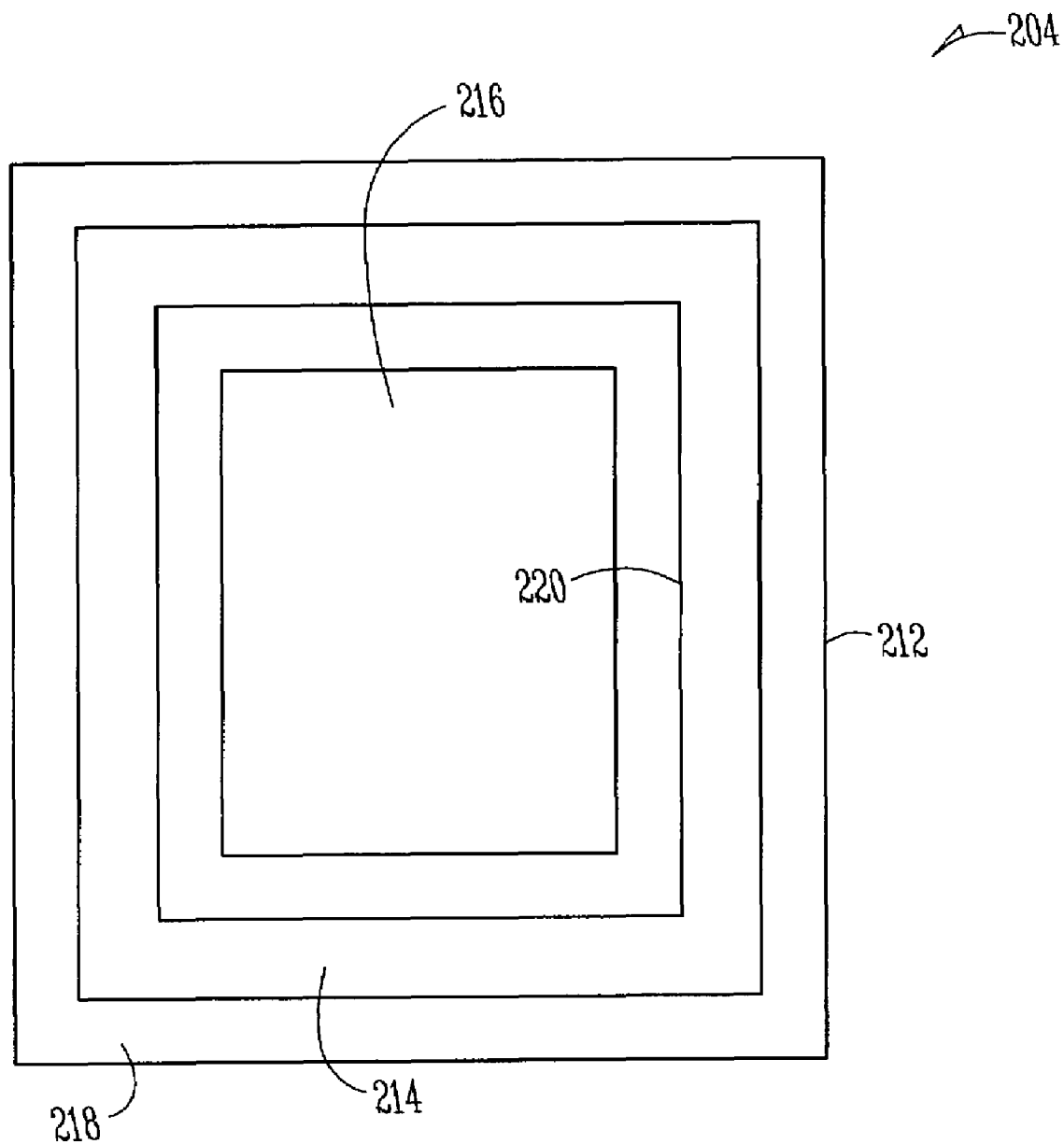
FIG. 2B is an illustration of a top view of one embodiment of the die-substrate assembly shown in FIG. 2A according to the teachings of the present invention.
Figure 2E:
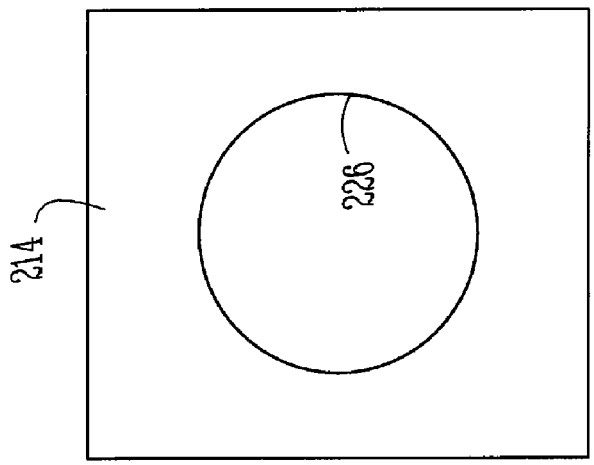
FIGS. 2C-2E are illustrations of some alternative embodiments of a layer included in the die-substrate assembly shown in FIG. 2B according to the teachings of the present invention.
Figure 2D:
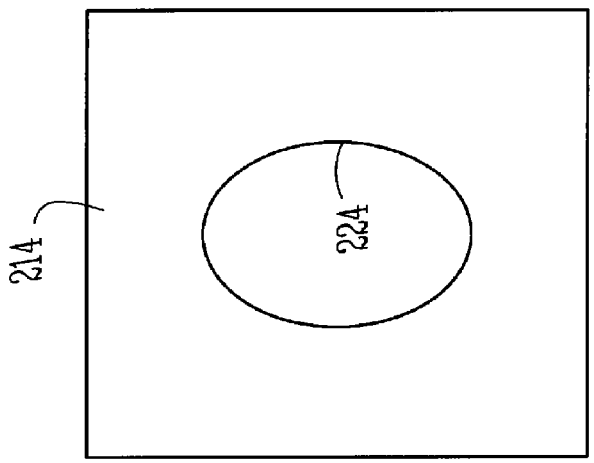
Figure 2C:
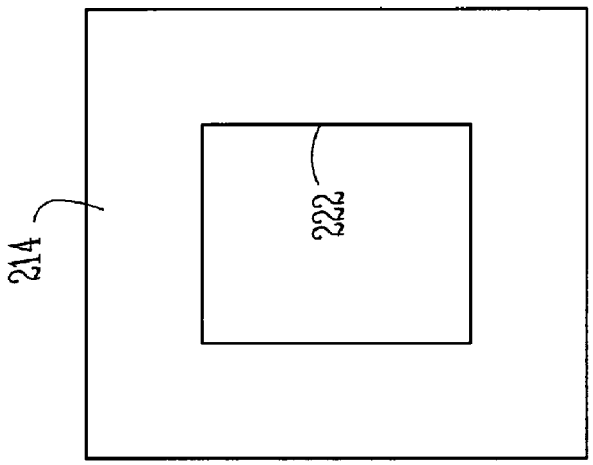
Figure 2H:
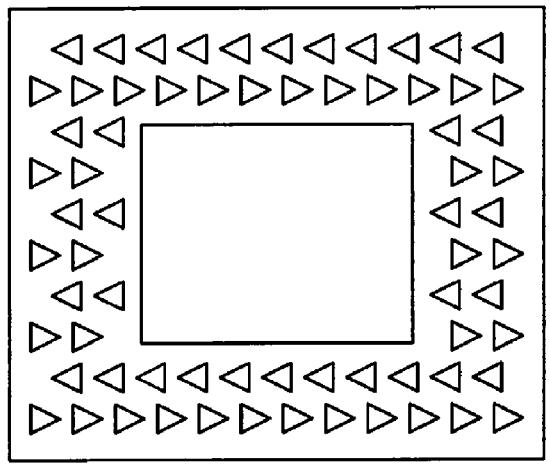
Figure 2G:
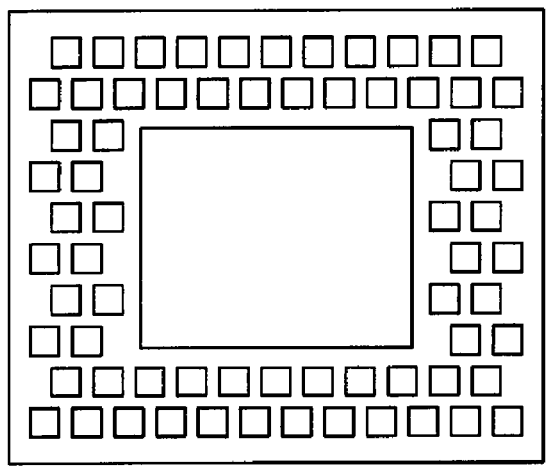
Figure 2F:
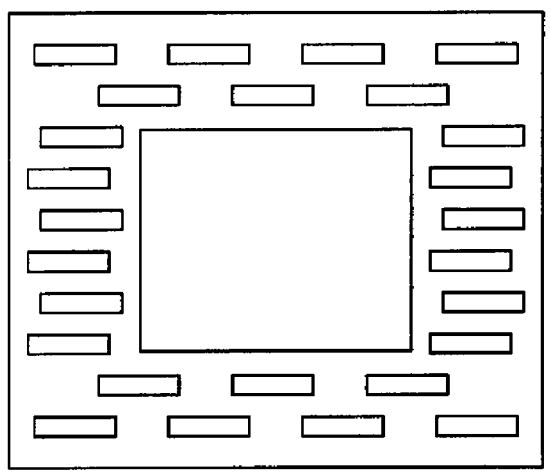

FIG. 2B is an illustration of a top view of one embodiment of the die-substrate assembly 204 shown in FIG. 2A according to the teachings of the present invention. As can be seen in FIG. 2B, the layer 214 is formed on a surface 218 of the layer 212 which is an outer or exposed surface of the substrate 210. The layer 214 has an annular shape including a substantially rectangular opening 220. However, the layer 214 is not limited to having a substantially rectangular opening. FIGS. 2C-2E are illustrations of some alternative embodiments of the layer 214 included in the die-substrate assembly shown in FIG. 2B according to the teachings of the present invention. As shown in FIG. 2C, the layer 214 has a substantially square opening 222. As shown in FIG. 2D, the layer 214 has a substantially elliptical opening 224. As shown in FIG. 2E, the layer 214 has a substantially circular opening 226. The layer 214 is not limited to being formed with an opening. In an alternative embodiment, the layer 214 can be formed without an opening. The layer 214 comprises a mesh including a plurality of openings. Each of the plurality of openings has a shape, but the openings are not limited to a particular shape. FIGS. 2F-2J are illustrations of some embodiments of a mesh having mesh opening shapes suitable for use in connection with the die-substrate assembly shown in FIG. 2A according to the teachings of teachings of the present invention. As shown in FIG. 2F, the mesh includes a plurality of substantially rectangular openings. As shown in FIG. 2G, the mesh includes a plurality of substantially square openings. As shown in FIG. 2H, the mesh includes a plurality of substantially triangular openings. As shown in FIG. 2I, the mesh includes a plurality of substantially elliptical openings. As shown in FIG. 2J, the mesh includes a plurality of substantially circular openings.

The layer 214 is not limited to being fabricated from a particular material. In some embodiments, the layer 214 is fabricated from a metal. Exemplary metals suitable for use in the fabrication of the mesh include but are not limited to copper, gold, silver, nickel and aluminum. The layer 214 is not limited to being fabricated using a particular method. One method of fabricating the layer 214 includes depositing a metal layer on the layer 214 and etching the desired annular opening and mesh openings in the metal layer. The layer 214 is deposited to a thickness that provides the necessary resistance to bowing for the selected mesh opening.

FIG. 2K is an illustration of a side view of an alternative embodiment of the die-substrate assembly 204 according to the teachings of the present invention. As shown in FIG. 2K, the layer 214 is an inner layer of the die-substrate assembly 204. An inner layer is a layer located between two other layers. Locating the layer 214 internal to the die-substrate assembly 204 permits the layer 214 to substitute for a ground or power plane in the die-substrate assembly 204. This substitution reduces the cost of the die-substrate assembly 204 while increasing the die-substrate assembly resistance to bowing or warping.

Referring again to FIG. 2A, the die 216 is mounted on the substrate 210 and includes an electronic circuit that performs an electronic function. In one embodiment, the die 216 includes an electronic circuit, such as a dynamic random access memory circuit or a static random access memory circuit, that performs a memory function. In an alternative embodiment, the die 216 includes an electronic circuit, such as an analog radio frequency amplifier, that performs an analog signal processing function. In another alternative embodiment, the die 216 includes an electronic circuit, such as a processor, that performs a logic function. In still another alternative embodiment, the die 216, includes an electronic circuit, such as a mixed-signal application specific integrated circuit for monitoring and controlling the performance of an automobile engine, that performs a combination of analog and digital circuit functions.

The die 216 is not limited to being fabricated from a particular material. In some embodiments, the die 216 is fabricated from a single type of semiconductor. For example, in one embodiment the die 216 is fabricated from silicon. In an alternative embodiment, the die 216 is fabricated from gallium arsenide. In still another alternative embodiment, the die 216 is fabricated from germanium. In other embodiments, the die 216 is fabricated from a combination of semiconductors. For example, in one embodiment the die 216 is fabricated from silicon and germanium. In an alternative embodiment, the die 216 is fabricated from silicon and gallium arsenide. In another alternative embodiment, the die 216 is fabricated from germanium and gallium arsenide.

As can be seen in FIG. 2A, the layer 214 stiffens the die-substrate assembly 204 and reduces warping in the die-substrate assembly 204. The layer 214 stiffens the die-substrate assembly 204 by providing a super-structure formed by the layer 214 to resist the stresses at the molding compound/substrate interface induced by shrinkage of the molding compound during curing.

Figure 2L:
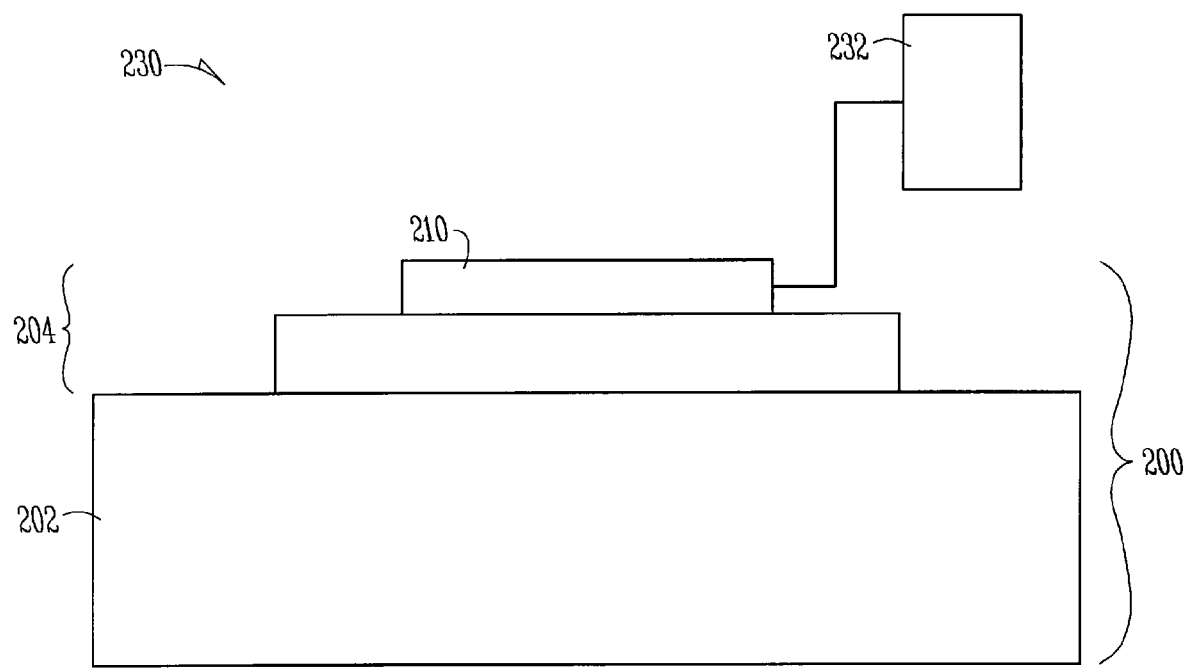
FIG. 2L is an illustration of system including a processor and a package according to the teachings of the present invention.

FIG. 2L is an illustration of system 230 including a processor 232 and a package 200 according to the teachings of the present invention. The system 230 is not limited to use in connection with a particular type of processor. Exemplary processors suitable for use in connection with the system 230 include complex instruction set processors, reduced instruction set processors, very long instruction word processors and digital signal processors. The processor 232 is communicatively coupled to the die 210 of the die-substrate assembly 204 mounted on the package substrate 202. The processor 222 can be communicatively coupled to the die 210 by physically connecting the processor 222 to the die 210 through a conductive element or communicatively coupled to the die 210 through a wireless communication link such as radio frequency communication link.

CONCLUSION

Although specific embodiments have been described and illustrated herein, it will be appreciated by those skilled in the art, having the benefit of the present disclosure, that any arrangement which is intended to achieve the same purpose may be substituted for a specific embodiment shown. This application is intended to cover any adaptations or variations of the present invention. Therefore, it is intended that this invention be limited only by the claims and the equivalents thereof.

In various embodiments, a package is provided that includes a package substrate, a die-substrate assembly and a molding compound. The die-substrate assembly includes a substrate that includes a plurality of layers. The plurality of layers includes a layer comprising a mesh to stiffen the substrate. The substrate is adapted to mount one or more dice, and the molding compound attaches the substrate to the package substrate.

In various alternative embodiments, the package includes a mesh formed from copper that includes a plurality of substantially circular openings.

These and other embodiments, aspects, advantages, and features of the various embodiments of the present invention are set forth in part in the present description, and in part will become apparent to those skilled in the art by reference to the description of the various embodiments of the present invention and by reference to the drawings or by practice of the embodiments of the present invention. The aspects, advantages, and features of the various aspects of the present invention are realized and attained by means of the instrumentalities, procedures, and combinations particularly pointed out in the appended claims.

What is claimed is:

1. A method comprising:

providing a substrate including a layer having an outer surface;

depositing a metal stiffening layer on the outer surface;

etching the metal stiffening layer to form an opening, the opening enclosing an area on the outer surface to mount one or more dice; and etching the metal stiffening layer to form a mesh having a plurality of mesh openings therethrough.

2. The method of claim 1, wherein the opening is a substantially square opening.

3. The method of claim 1, wherein the opening is a substantially rectangular opening.

4. The method of claim 1, wherein the opening is a substantially elliptical opening.

5. The method of claim 1, wherein the opening is a substantially circular opening.

6. The method of claim 1, wherein depositing the metal layer includes depositing the metal layer including copper.

7. The method of claim 1, wherein depositing the metal layer includes deposing the metal layer including nickel.

8. The method of claim 1, wherein depositing the metal stiffening layer includes depositing a single metal stiffening layer on the outer surface.

9. A method comprising:
   providing a substrate including a layer having an exposed surface;
   depositing a metal stiffening layer on the exposed surface;
   etching the metal stiffening layer to form an opening having an annular shape, the opening enclosing an area on the exposed surface, the enclosed area adapted to mount one or more dice; and
   etching the metal stiffening layer to form a mesh having a plurality of mesh openings therethrough.

10. The method of claim 9, wherein the layer is fabricated from an insulator.

11. The method of claim 9, wherein depositing the metal layer includes depositing copper.

12. The method of claim 9, wherein depositing the metal layer includes depositing gold.

13. The method of claim 9, wherein depositing the metal layer includes depositing aluminum.

14. The method of claim 9, wherein etching the metal layer to form a plurality of mesh openings includes forming a plurality of substantially rectangular openings.

15. The method of claim 9, wherein etching the metal layer to form a plurality of mesh openings includes forming a plurality of substantially square openings.

16. The method of claim 9, wherein etching the metal layer to form a plurality of mesh openings includes forming a plurality of substantially triangular openings.

17. The method of claim 9, wherein etching the metal layer to form a plurality of mesh openings includes forming a plurality of substantially elliptical openings.

18. The method of claim 9, wherein etching the metal layer to form a plurality of mesh opening includes forming a plurality of substantially circular openings.

19. The method of claim 9, wherein depositing the metal stiffening layer includes depositing a single metal stiffening layer on the exposed surface.

20. A method comprising:
   providing a substrate including a layer having an exposed surface;
   depositing a metal stiffening layer on the exposed surface, wherein the depositing includes depositing one of copper, gold, or aluminum;
   etching the metal stiffening layer to form an opening having an annular shape, the opening enclosing an area on the exposed surface, the enclosed area adapted to mount one or more dice; and
   etching the metal stiffening layer to form a mesh having a plurality of mesh openings therethrough, wherein the mesh openings have a shape including one of a substantially rectangular, substantially square, substantially triangular, substantially elliptical, or substantially circular shape.

21. The method of claim 20, wherein the layer is fabricated from an insulator.

22. The method of claim 20, wherein depositing the metal stiffening layer includes depositing a single metal stiffening layer on the outer surface.

* * * * *